United States Patent [19]
Roth et al.

[11] Patent Number: 5,943,274
[45] Date of Patent: Aug. 24, 1999

[54] METHOD AND APPARATUS FOR AMPLIFYING A SIGNAL TO PRODUCE A LATCHED DIGITAL SIGNAL

[75] Inventors: Alan S. Roth; Scott G. Nogle, both of Austin, Tex.

[73] Assignee: Motorola, Inc., Schaumburg, Ill.

[21] Appl. No.: 09/016,914

[22] Filed: Feb. 2, 1998

[51] Int. Cl.[6] .................................................. G11C 13/00
[52] U.S. Cl. ............... 365/189.11; 365/148; 365/189.05; 365/194; 365/208
[58] Field of Search .......................... 365/189.11, 189.05, 365/194, 208, 148

[56] References Cited

U.S. PATENT DOCUMENTS

| | | | |
|---|---|---|---|
| 5,515,334 | 5/1996 | Kotani et al. | 365/189.11 X |
| 5,680,066 | 10/1997 | Akioka et al. | 365/233.5 X |
| 5,703,827 | 12/1997 | Leung et al. | 365/189.11 X |
| 5,781,480 | 7/1998 | Nogle et al. | 365/230.05 X |
| 5,798,972 | 8/1998 | Lao et al. | 365/189.05 X |

*Primary Examiner*—Do Hyun Yoo
*Attorney, Agent, or Firm*—Susan C. Hill

[57] ABSTRACT

Method and apparatus for amplifying a signal (50) to produce a latched digital signal (46). In one embodiment, an output stage circuit (24) of memory (10) includes a differential amplifier circuit (100), a level converter (102), a timing circuit (104), a clock-free latch (106), a high impedance control circuit (108), a high impedance control circuit (110), and an output driver (112). Output stage (24) requires one clock signal to function. Alternate embodiments may skew the disabling edge of the clock to improve the speed characteristics of output stage (24). In one embodiment, signal (50) is a differential pair of signals provided from a memory bit cell array (12).

24 Claims, 2 Drawing Sheets

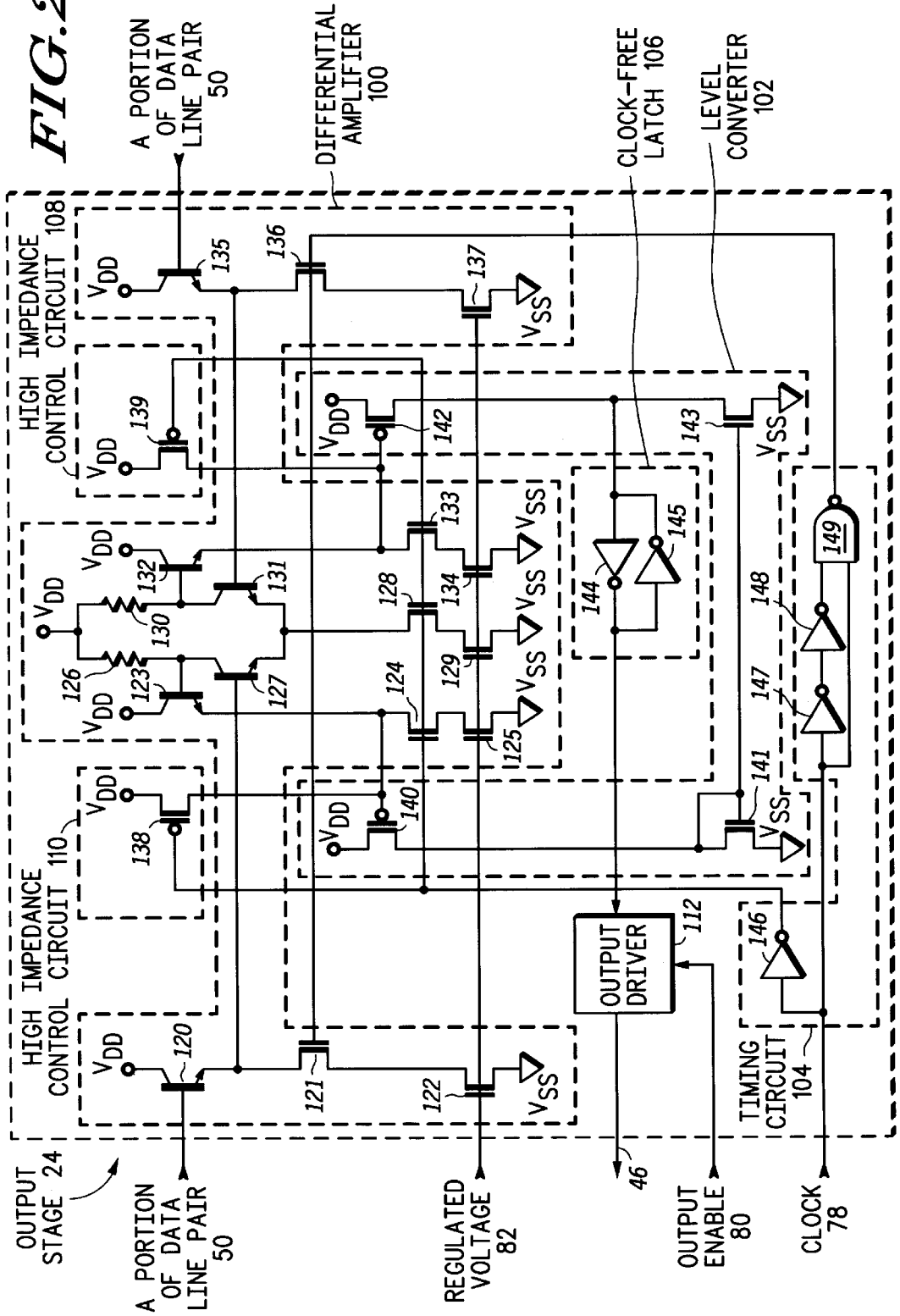

5,943,274

METHOD AND APPARATUS FOR AMPLIFYING A SIGNAL TO PRODUCE A LATCHED DIGITAL SIGNAL

FIELD OF THE INVENTION

The present invention relates in general to a method and apparatus for amplifying a signal to produce a latched digital signal, and more particularly to an output stage of a memory.

REFERENCE TO RELATED APPLICATIONS

The present application is related to the following U.S. patent applications, "Pipelined Dual Port Integrated Circuit Memory", invented by Scott G. Nogle et al., having Ser. No. 08/902,009, filed Jul. 29, 1997, now U.S. Pat. No. 5,781,480, and assigned to the assignee hereof; and "Comparison Circuit Utilizing a Differential Amplifier", invented by Scott G. Nogle et al., having Ser. No. 09/016,940, filed Feb. 2, 1998, and assigned to the assignee hereof.

BACKGROUND OF THE INVENTION

Memory integrated circuits commonly use a differential amplifier between the bit cell array and the data output signals which are provided external to the memory. The differential amplifier detects a small voltage difference and amplifies that small voltage difference into a larger voltage difference, e.g. CMOS (complementary metal oxide semiconductor) levels. It is also common for memories to latch the data output signals between the differential amplifier and the data I/O pad in order to provide a consistent logic level one or logic level zero at the data I/O pad while the differential amplifier is detecting the next data value. Prior art circuits exist which use two clock signals: one clock signal to clock the differential amplifier portion, and one clock signal to clock the latch portion of the memory output stage. A problem arises, however, when the timing relationship between the two clocks cannot be consistently controlled due to manufacturing process variations, temperature variations, power supply voltage variations, etc. It is thus advantageous to develop a memory output stage circuit that does not require two or more clocks, and thus does not require that a precise timing relationship between two or more clocks be maintained. In addition, it is advantageous for the memory output stage to be as fast as possible.

BRIEF DESCRIPTION OF THE DRAWINGS

FIG. 2 illustrates in partial block diagram form and partial schematic diagram form output stage 24 of FIG. 1 in accordance with one embodiment of the present invention.

DETAILED DESCRIPTION

Figure 1:
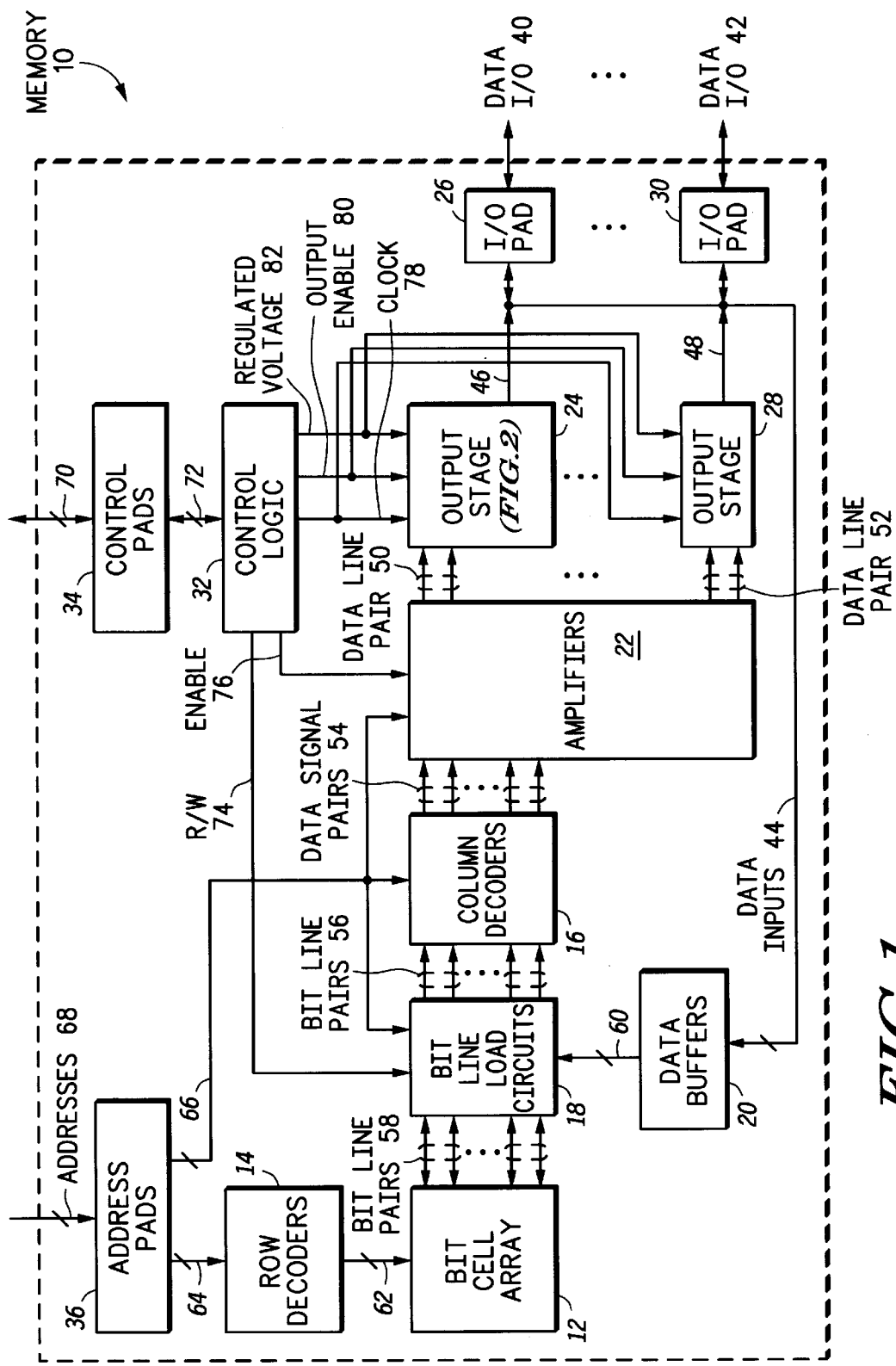
FIG. 1 illustrates in block diagram form a memory 10 in accordance with one embodiment of the present invention.

Throughout the following descriptions, the terms VDD and VSS refer to power supply voltages where VDD is more positive than VSS. In one embodiment, VDD is approximately 3.3 volts and VSS is approximately 0 volts; however, alternate embodiments may use different values for VDD and VSS. The terms logic level low and logic level high correspond to logic level zero and logic level one, respectively. If the logic level one indicates a logically true state, then the logic level zero will indicate a logically false state. And if the logic level zero indicates a logically true state, then the logic level one will indicate a logically false state.

DESCRIPTION OF THE FIGURES

FIG. 1 illustrates one embodiment of memory 10. Memory 10 includes bit cell array 12 which has a plurality of memory bit cells within it. In one embodiment of the present invention, memory 10 is an SRAM (static random access memory). Alternate embodiment of the present invention may use other types of memory. Bit cell array 12 is coupled by signal 62 to row decoders 14. Row decoders 14 receive address signals 64 from address pads 36. Address pads 36 receive address signals 68 from external to memory 10. Address signals 64 and 66 may be different portions of address signals 68. Address pads 36 also provide address signals to bit line load circuits 18, to column decoders 16, and to amplifiers 22. Note that circuits 16, 18 and 22 may receive different portions of address signal 66. Bit cell array 12 is bi-directionally coupled to bit line load circuits 18 by way of bit line pairs 58. Bit line load circuits 18 is coupled to column decoders 16 by way of bit line pairs 56.

Column decoders 16 are coupled to amplifiers 22 by way of data signal pairs 54. Amplifiers 22 are coupled to output stage 24 by way of data line pair 50. Amplifiers 22 are coupled to output stage 28 by way of data line pair 52. Note that the embodiment of memory 10 illustrated in FIG. 1 may include any number of output stage circuits 24, 28. Similarly, each output stage circuit 24, 28 has a corresponding I/O (input/output) pad 26,30. Output stage 24 provides a signal 46 to I/O pad 26. Output stage 28 provides an output signal 48 to I/O pad 30. Each I/O pad 26,30 has a corresponding data I/O signal 40,42. I/O pad 26 is bi-directionally coupled to data I/O signal 40 to receive and provide data information. I/O pad 30 is bi-directionally coupled to data I/O signal 42 in order to receive and provide data information. I/O pad 26 and I/O pad 30 are coupled to data inputs 44 in order to provide data information to data buffers 20. Data buffers 20 then provide this information to bit load line circuits 18 by way of conductors 60.

Memory 10 includes control logic 32 which is bi-directionally coupled to control pads 34 by way of conductors 72. Control pads 34 may receive and provide control signals external to memory 10 by way of conductors 70. Control logic 32 provides a read/write (R/W) signal 74 to bit line load circuits 18. Control logic 32 provides an enable signal 76 to amplifiers 22. Control logic 32 provides a clock signal 78 to each one of the output stage circuits 24, 28. Control logic 32 provides an output enable signal 80 to each one of the output stage circuits 24, 28. Control logic 32 provides a regulated voltage 82 to each one of the output stage circuits 24, 28.

FIG. 2 illustrates one embodiment of output stage circuit 24 of FIG. 1. Note that FIG. 2 may also illustrate one embodiment of output stage circuit 28 of FIG. 1.

In one embodiment, output stage circuit 24 includes differential amplifier 100, level converter circuit 102, timing circuit 104, clock-free latch circuit 106, high impedance control circuit 108, high impedance control circuit 110, and output driver circuit 112.

In one embodiment, differential amplifier 100 includes bipolar transistor 120, n-channel field effect transistor (FET) 121, n-channel FET transistor 122, bipolar transistor 123, n-channel FET transistor 124, n-channel FET transistor 125, resistor 126, bipolar transistor 127, n-channel FET transistor 128, n-channel FET transistor 129, resistor 130, bipolar transistor 131, bipolar transistor 132, n-channel FET transistor 133, n-channel FET transistor 134, bipolar transistor 135, n-channel FET transistor 136, and n-channel FET transistor 137.

In one embodiment, level converter 102 includes p-channel FET transistor 140, n-channel FET transistor 141, p-channel FET transistor 142, and n-channel FET transistor 143. In one embodiment, timing circuit 104 includes inverters 146, 147, and 148 as well as NAND gate 149.

In one embodiment, clock-free latch 106 includes cross-coupled inverters 144,145. In one embodiment, high impedance control circuit 108 includes a single p-channel FET transistor 139 which functions as a switching element. In one embodiment, high impedance control circuit 110 includes a single p-channel FET transistor 138. Note that alternate embodiments of the present invention may use different circuit elements than those illustrated in FIG. 2.

The connectivity of the circuit elements illustrated in FIG. 2 will now be described. A first signal of data line pair 50 is coupled to the base of transistor 120 while the second signal of data line pair 50 is coupled to the base of transistor 135. The collector of transistor 120 is coupled to VDD. The emitter of transistor 120 is coupled to a first current electrode of transistor 121 and to the base of transistor 127. The second current electrode of transistor 121 is coupled to the first current electrode of transistor 122. The second current electrode of transistor 122 is coupled to VSS. The control electrode of transistor 121 and the control electrode of transistor 136 are both coupled to the output of NAND gate 149. The collector of transistor 123 is coupled to VDD. The base of transistor 123 is coupled to the second terminal of resistor 126 and to the collector of transistor 127. The emitter of transistor 123 is coupled to the first current electrode of transistor 124, to the control electrode of transistor 140, and to the second current electrode of transistor 138. The emitter of transistor 127 is coupled to the emitter of transistor 131 and to the first current electrode of transistor 128. The collector of transistor 131 is coupled to the second current electrode of resistor 130 and to the base electrode of transistor 132.

Continuing with FIG. 2, the first terminal of resistor 126, the first terminal of resistor 130, and the collector of transistor 132 are each coupled to VDD. The emitter of transistor 132 is coupled to the first current electrode of transistor 133 to the control electrode of transistor 142 and to the second current electrode of transistor 139. The first current electrode of transistor 138 and the first current electrode of transistor 139 are each coupled to VDD. The collector of transistor 135 is coupled to VDD. The emitter of transistor 135 is coupled to the base of transistor 131 and to the first current electrode of transistor 136. The second current electrode of transistor 136 is coupled to the first current electrode of transistor 137. The second current electrode of transistor 137, the second current electrode of transistor 134, the second current electrode of transistor 129 and the second current electrode of transistor 125 are each coupled to VSS. The control electrode of transistors 137, 134, 129, 125, and 122 are all coupled to receive a regulated voltage signal 82. The control electrode of transistors 138, 139, 133, 128, and 124 are all coupled to the output of inverter 146.

Still referring to FIG. 2, the first current electrode of transistor 125 is coupled to the second current electrode of transistor 124. The first current electrode of transistor 129 is coupled to the second current electrode of transistor 128. The first current electrode of transistor 134 is coupled to the second current electrode of transistor 133. Inverter 146 and inverter 147 receive clock signal 78 as an input. The output of inverter 147 is coupled to the input of inverter 148. The output of inverter 148 is coupled to the first input of NAND gate 149. The second input of NAND gate 149 is coupled to received clock signal 78. Output driver circuit 112 receives output enable signal 80 as an input. Output driver 112 is coupled to the output of inverter 144 and to the input of inverter 145. Output driver 112 provides an output signal 46. The input of inverter 144 and the output of inverter 145 are coupled to the second current electrode of transistor 142 and to the first current electrode of transistor 143. The first current electrode of transistors 142 and 140 are each coupled to VDD. The second current electrode of transistors 143 and 141 are each coupled to VSS. The control electrode of transistor 143 is coupled to the control electrode of transistor 141, to the first current electrode of transistor 141, and to the second current electrode of transistor 140.

DESCRIPTION OF OPERATION

With the exception of output stage circuits 24 and 28, memory 10 may function as a standard memory. Memory 10 may be manufactured on a single integrated circuit or may be combined with other functions, such as one or more processing units, and formed on an integrated circuit. In one embodiment, memory 10 may be an SRAM (static random access memory). Alternate embodiments of the present invention may use other types of memory 10. In general, memory 10 functions as follows. Addresses are provided to memory 10 by way of conductors 68. Portions of the address signals are then provided to row decoders 14, bit line load circuits 18, column decoder 16, and amplifiers 22. Data is received by memory 10 by way of data I/O signals 40 and 42, I/O pads 26 and 30, data buffers 20, and bit line load circuits 18. Data is then provided external to memory 10 from bit cell array 12 by way of bit line pairs 58 and 56, data signal pairs 54, data line pairs 50 and 52, signals 46 and 48, and data I/O signals 40 and 42. Control logic 32 provides the control signals necessary to operate memory 10. Note that control logic 32 provides signals, only some of which are shown, to all blocks of circuitry illustrated in FIG. 1. Control logic 32 receives control information from external to memory 10 by way of control pads 34 and conductors 70. If control logic 32 is required to provide information external to memory 10, e.g. status information, test information, etc., control pads 34 and conductors 70 may be used.

In one embodiment of the present invention, output stage circuits 24 and 28 include an amplification function. Alternate embodiments of the present invention may or may not use amplifiers 22 in addition to the amplification function performed in output stages 24 and 28.

FIG. 2 illustrates one embodiment of output stage circuits 24 and 28 of FIG. 1. Although output stage 24 will be described using the embodiment illustrated in FIG. 2, a variety of alternate embodiments may be used as well. In the embodiment of output stage circuit 24 illustrated in FIG. 2, transistors 122, 125, 129, 134, and 137 all receive a regulated voltage at their control electrodes to provide a drain current which is substantially independent of the power supply voltage and temperature. Note that in an alternate embodiment, each of n-channel transistors 122, 125, 129, 134, and 137 may use a very weak n-channel FET transistor in a parallel configuration (not shown) in order to maintain the differential amplifier 100 nodes at the desired voltages, regardless of any leakage currents that may exist when the differential amplifier 100 is disabled. Of course in order to function effectively, these optional very weak n-channel FET transistors will not be disabled by gating transistors 121, 124, 128, 133, and 136.

Transistors 120 and 135 are configured to operate as emitter followers. Thus, each of transistors 120 and 135 provides a voltage drop and provides some isolation between the data line pair 50 and the emitter coupled pair (which includes transistors 127 and 131) in order to increase the speed of differential amplifier 100.

Transistors 123 and 132 function as emitter followers and provide the output of differential amplifier 100. The emitter coupled pair (transistors 127, 131) are used to direct the current through resistors 126 and 130 such that a larger voltage differential is achieved between the base electrode of transistor 123 and the base electrode of transistor 132. When differential amplifier 100 is enabled, this "larger" voltage differential will always be larger than the voltage differential between the two signals forming data line pair 50. Transistors 123 and 132 then function as emitter followers which provide the larger differential voltage to the input of level converter 102 at the control electrodes of transistor 140 and 142.

In one embodiment of the present invention, differential amplifier 100 may be selectively enabled and disabled in order to reduce power consumption. Thus, clock 78 and timing circuit 104 provide two clock signals to differential amplifier 100 to provide selective enablement and disablement. Note that these two clock signals are not required in the present invention, but are merely used to reduce power and to increase speed. The present invention merely requires a single clock signal. In one embodiment, timing circuit 104 is used to provide two versions of clock signal 78, one which has a falling edge that is slightly delayed compared to the other version of clock 78. Note that the two versions of clock 78 produced by the embodiment of timing circuit 104 illustrated in FIG. 2 have approximately simultaneous rising edges. Thus, the enabling edge of these two clock signals are approximately simultaneous, while the disabling edges of these two clock signals are purposely skewed. Again, these are not separate clock signal as used by the prior art, but are merely different versions of the same clock which have a delay between their disabling edges. Note that the timing relationship of these two versions of clock 78 will never vary enough due to manufacturing process variations, temperature variations, power supply voltage variations, etc. so that output stage 24 is no longer functional. Also, some embodiments of the present invention may use clock 78 directly as the only clock, without using timing circuit 104 to create two slightly different versions.

The delayed disabling clock edge is provided to the control electrode of transistors 121 and 136 in order to delay the disablement of the input emitter followers of differential amplifier 100. The non-delayed disablement clock is provided to the control electrode of transistors 124, 128, and 133 in order to disable the emitter coupled pair (transistors 127, 131) and the output emitter followers (transistors 123, 132) before the input emitter followers (transistors 120, 135) are disabled. Note that by the term "disablement" what is meant is disabling the current provided by transistors 122, 125, 129, 134, and 137. In one embodiment of the present invention, the purpose of providing two separate clock disablement edges is to prevent feedback due to parasitic capacitances in the emitter coupled pair (transistors 127, 131). The parasitic capacitances in the emitter coupled pair(transistors 127, 131) may include the Miller capacitance from the collector to the base of transistors 127 and 131.

The output of differential amplifier 100 is then provided to the input of level converter 102. Level converter 102 works in conjunction with high impedance control circuits 108 and 110. Level converter 102 is used to convert small signal inputs to nearly CMOS level outputs. Note that transistors 138 and 139 of high impedance control circuits 110 and 108 receive the non-delayed disablement clock that is provided to differential amplifier 100. If the non-delayed disablement clock is a logic level low, transistors 138 and 139 are conducting, and thus VDD is provided to the gates of transistors 140 and 142. As a result, transistors 140, 141, 142, and 143 are all non-conducting. Thus inverter 145, which may be a weak inverter in some implementations, is used to hold its output node at the pre-existing level while level converter 102 is disabled. This in effect provides a high impedance state, although inverter 145 is providing a weak drive capability. Note that by "weak" what is meant is that the drive strength of inverter 145 is less than the drive strength of level converter 102.

If the non-delayed disablement clock is a logic level high, transistors 138 and 139 are non-conducting and, thus, the output of differential amplifier 100 (i.e. the emitters of transistors 123 and 132) provides the amplified differential voltage to the gates of transistors 140 and 142. As a result, level converter 102 is enabled and one of transistors 142 and 143 is conducting. Which one of transistors 142 and 143 is conducting is determined by which signal of data line pair 50 is at a higher voltage. Thus, inverter 145, which may be a weak inverter in some implementations, may be momentarily over-driven by level converter 102 at the new logic level while level converter 102 is enabled. And, inverter 145 will then subsequently drive the same new logic level as level converter 102. This in effect provides a new data value to be stored in clock-free latch 106.

When differential amplifier 100 is enabled, level converter 102 is also enabled and level converter 102 drives either a logic level zero or a logic level one to the input of inverter 144. The logic level provided by level converter 102 to the input of inverter 144 is determined by whether the data line pair 50 signal provided to the base of transistor 120 is a higher or lower voltage than the data line pair 50 signal provided to the base of transistor 135. Level converter 102 is re-enabled by providing a logic level high signal to the control electrodes of transistors 138 and 139. Thus, level converter 102, when enabled, may provide a new value to be stored in clock-free latch 106. Clock-free latch 106 will then store that new value even when level converter 102 is subsequently disabled. Clock-free latch 106 thus stores the value to be provided to output driver 112.

In alternate embodiments of the present invention, output driver circuit 112 may include a variety of buffers, one or more output enable control circuits, and any other type of circuit that may be used to drive signal 46 to I/O pad 26 (See FIG. 1). The logic level of signal 46 is then provided external to memory 10 by way of data I/O signal 40. In alternate embodiments of the present invention, output stage circuit 28 (See FIG. 1) may be identical to the circuit illustrated in FIG. 2. In alternate embodiments of the present invention, output stage circuit 28 may be different than the circuit used for output stage 24.

It is to be understood, therefore, that this invention is not limited to the particular forms illustrated and that the appended claims cover all modifications that do not depart from the spirit and scope of this invention.

We claim:

1. An apparatus for use as an output stage of a memory device, the apparatus comprising:

a timing circuit;

a differential amplifier responsive to the timing circuit;

an impedance control circuit;

a level converter responsive to the differential amplifier and the impedance control circuit; and a clock-free latch responsive to the level converter.

2. The apparatus of claim 1, wherein the timing circuit is a clock delay circuit.

3. The apparatus of claim 1, wherein the clock-free latch includes a first inverter and a second inverter.

4. The apparatus of claim 1, wherein the timing circuit receives a clock signal.

5. The apparatus of claim 4, wherein the clock-free latch performs a latching function in response to the level converter providing a modified impedance output.

6. The apparatus of claim 5, wherein the level converter produces the modified impedance output in response to the clock signal.

7. The apparatus of claim 6, wherein the level converter produces the modified impedance output when first and second outputs of the differential amplifier have substantially the same voltage level indicating a modified impedance condition.

8. The apparatus of claim 1, further comprising a driver module responsive to the clock-free latch, the driver module receiving an output enable signal and producing an output signal.

9. The apparatus of claim 1, wherein the level converter includes a plurality of transistors.

10. The apparatus of claim 1, wherein the differential amplifier has an output driven by at least one of an emitter and a source of a transistor.

11. The apparatus of claim 1, wherein the impedance control circuit is a switching element connected to a power source.

12. The apparatus of claim 1, wherein the differential amplifier receives a regulated voltage signal.

13. The apparatus of claim 1, wherein:

the timing circuit includes a first inverter to produce a first clock signal, a second inverter, a third inverter, and a NAND gate to produce a second clock signal;

the differential amplifier includes a first pair of transistors, a second pair of transistors, and a third pair of transistors, the first pair of transistors comprising an emitter coupled pair, the second and third pair of transistors comprising emitter followers, a resistive load, and a plurality of current sources, each of the pairs of transistors responsive to at least one of the plurality of current sources, the resistive load being responsive to the first pair of transistors;

the impedance control circuit includes a first field effect transistor and a second field effect transistor;

the level converter includes a fourth pair of transistors of a first conductivity type and a fifth pair of transistors of a second conductivity type; and the clock-free latch includes a fourth inverter and a fifth inverter coupled to the fourth inverter.

14. A method of amplifying a signal to produce a latched digital signal, the method comprising the steps of:

amplifying a differential input to produce a differential output in response to a clock signal;

level converting the differential output to produce a level converted signal;

detecting a change in impedance at an input of a clock-free latch and latching the level converted signal at the clock-free latch to produce the latched digital signal; and outputting the latched digital signal.

15. The method of claim 14, further comprising the step of providing the level converted signal to the clock-free latch.

16. The method of claim 14, further comprising the step of buffering the latched digital signal to produce an output signal.

17. The method of claim 14, further comprising the step of turning off a first stage of a differential amplifier at a first time and turning off a second stage of the differential amplifier at a second time.

18. The method of claim 17, wherein the first stage includes a first pair of transistors and the second stage includes a second pair of transistors.

19. The method of claim 18, wherein the first pair of transistors is an emitter coupled pair of transistors and the second pair of transistors is an emitter follower pair of transistors.

20. A method of amplifying a signal to produce a latched digital signal, the method comprising the steps of:

amplifying and level converting a differential input to produce a level converted signal in response to a clock signal;

detecting a change in impedance at an input of a clock-free latch and latching the level converted signal at the clock-free latch to produce the latched digital signal; and outputting the latched digital signal.

21. A memory device comprising:

bit cell array;

an amplifier module responsive to the bit cell array; and an output stage responsive to the amplifier module, the output stage comprising:

a differential amplifier responsive to a clock signal;

a high impedance control circuit;

a level converter responsive to the differential amplifier and responsive to the high impedance control circuit; and a clock-free latch responsive to the level converter.

22. The memory device of claim 21, further comprising a plurality of output stages and a plurality of data outputs.

23. The memory device of claim 22, further comprising a bit line load array coupling the bit cell array and the amplifier module.

24. The memory device of claim 22, wherein at least two of the plurality of output stages have a shared input from the amplifier module.

* * * * *